United States Patent
Killampalli et al.

(10) Patent No.: US 9,224,602 B2
(45) Date of Patent: Dec. 29, 2015

(54) SUB-SECOND ANNEALING LITHOGRAPHY TECHNIQUES

(75) Inventors: Aravind S. Killampalli, Hillsboro, OR (US); Charles H. Wallace, Portland, OR (US); Bernhard Sell, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 142 days.

(21) Appl. No.: 13/976,088

(22) PCT Filed: Dec. 29, 2011

(86) PCT No.: PCT/US2011/067931
§ 371 (c)(1),
(2), (4) Date: Jun. 26, 2013

(87) PCT Pub. No.: WO2013/101109
PCT Pub. Date: Jul. 4, 2013

(65) Prior Publication Data
US 2014/0117489 A1 May 1, 2014

(51) Int. Cl.
*G03F 7/40* (2006.01)
*H01L 21/263* (2006.01)
*H01L 21/027* (2006.01)
*H01L 21/033* (2006.01)

(52) U.S. Cl.
CPC .............. *H01L 21/2636* (2013.01); *G03F 7/40* (2013.01); *H01L 21/0273* (2013.01); *H01L 21/0337* (2013.01)

(58) Field of Classification Search
CPC ..... G03F 7/2051; G03F 7/40; H01L 21/0273; H01L 21/2636
See application file for complete search history.

(56) References Cited

U.S. PATENT DOCUMENTS 6,117,622 A 9/2000 Eisele et al.
7,825,041 B2 * 11/2010 Kim et al. .................... 438/780
7,892,971 B2 2/2011 Hwang et al.
2009/0130864 A1 5/2009 Mehta et al.
2014/0011373 A1 1/2014 Killampall et al.

FOREIGN PATENT DOCUMENTS

| | | |
|---|---|---|
| JP | 2001-307993 A | 11/2001 |
| JP | 2005-268627 A | 9/2005 |
| JP | 2007-027574 A | 2/2007 |
| KR | 1999-0031753 A | 5/1999 |
| KR | 1999-0061995 A | 7/1999 |
| KR | 2006-0053065 A | 5/2006 |
| KR | 2009-0086821 A | 8/2009 |
| WO | 2013/100955 A1 | 7/2013 |
| WO | 2013/101109 A1 | 7/2013 |

OTHER PUBLICATIONS

International Search Report and Written Opinion received for PCT Patent Application No. PCT/US2011/067539, mailed on Jul. 18, 2012, 9 Pages.
International Search Report and Written Opinion received for PCT Patent Application No. PCT/US2011/067931, mailed on Sep. 24, 2012, 11 Pages.
International Preliminary Report on Patentability received for PCT Patent Application No. PCT/US2011/067931, mailed on Jul. 10, 2014, 7 Pages.

* cited by examiner

*Primary Examiner* — Kathleen Duda
(74) *Attorney, Agent, or Firm* — Finch & Maloney PLLC (57) ABSTRACT

Techniques are disclosed for sub-second annealing a lithographic feature to, for example, tailor or otherwise selectively alter its profile in one, two, or three dimensions. Alternatively, or in addition to, the techniques can be used, for example, to smooth or otherwise reduce photoresist line width/edge roughness and/or to reduce defect density. In some cases, the sub-second annealing process has a time-temperature profile that can effectively change the magnitude of resist shrinkage in one or more dimensions or otherwise modify the resist in a desired way (e.g., smooth the resist). The techniques may be implemented, for example, with any type of photoresist (e.g., organic, inorganic, hybrid, molecular photoresist materials) and can be used in forming, for instance, processor microarchitectures, memory circuitry, logic arrays, and numerous other digital/analog/hybrid integrated semiconductor devices.

16 Claims, 6 Drawing Sheets

Figure 1A

Figure 2A
Top-Down View

Figure 2B
Cross-Section View

SUB-SECOND ANNEALING LITHOGRAPHY TECHNIQUES

BACKGROUND

Integrated circuit design in the deep-submicron process nodes (e.g., 32 nm and beyond) involves a number of non-trivial challenges, and circuits incorporating microelectronic components generated via lithographic processes have faced particular complications at these levels, such as those with respect to achieving ever-smaller and more precise device features. Continued process scaling will tend to exacerbate such problems.

DETAILED DESCRIPTION

Techniques are disclosed for sub-second annealing a lithographic feature to, for example, tailor or otherwise selectively alter its profile in one, two, or three dimensions. Alternatively, or in addition to, the techniques can be used, for example, to smooth or otherwise reduce photoresist line width/edge roughness and/or to reduce defect density. In some cases, the sub-second annealing process has a time-temperature profile that can effectively change the magnitude of resist shrinkage in one or more dimensions or otherwise modify the resist in a desired way (e.g., smooth the resist). The techniques may be implemented, for example, with any type of photoresist (e.g., organic, inorganic, hybrid, molecular photoresist materials) and can be used in forming, for instance, processor microarchitectures, memory circuitry, logic arrays, and numerous other digital/analog/hybrid integrated semiconductor devices.

General Overview

Conventional lithography techniques used in circuit design are associated with a number of non-trivial issues. For instance, conventional lithography techniques are reaching the limits of resolution, requiring new methodologies to generate/print feature sizes beyond the 32 nm node. Some such methodologies include double or multiple exposure techniques, self-aligned spacer, and dual-tone photoresists. With the emergence of double/multiple patterning, additional non-lithographic techniques such as resist trimming, thermal re-flow, and resist freezing can be employed. Resist freezing can be used to modify the three-dimensional profile of a given photoresist pattern and/or physically/chemically harden the photoresist material before subsequent patterning steps. However, resist freezing involves usage of various chemical or physical freezing (protection) techniques which may cause unwanted/un-tunable shrinkage or growth of the photoresist after the freezing process. Additionally, resist freezing may cause changes to the physical properties and/or profile of the photoresist pattern, which may lead to unwanted/un-tunable feature variations and impede manufacturing consistency.

Thus, and in accordance with an embodiment of the present invention, techniques for sub-second annealing a photoresist feature are disclosed. Sub-second annealing may be implemented, in various embodiments of the present invention, to tailor or otherwise modify photoresist profile in one, two, or three dimensions. Alternatively, or in addition to, sub-second annealing can be used to effectively smooth the photoresist lines and/or otherwise reduce photoresist line width and edge roughness. Alternatively, or in addition to, sub-second annealing can be used to reduce defect density for a given application. As will further be appreciated in light of this disclosure, sub-second annealing may be implemented to achieve, in some example cases, subtle changes/alterations to photoresist features, such as rounding of corners and altering the footing of photoresist profiles. In a more general sense, sub-second annealing can be used to tailor resist profile to meet a given target.

In more detail, by selectively changing the time-temperature profile of the sub-second annealing process, the magnitude of resist shrinkage in one or more dimensions can be changed. Thus, a resist feature can be shrunk along the x-axis or in the transverse direction, along the y-axis or in the longitudinal direction, and/or along the z-axis or in the vertical direction. The shrinkage of the resist pattern in turn allows the features formed from that resist pattern to be smaller than they otherwise would be. In this sense, the techniques provided herein allow the critical dimension of a specific type of lithography equipment (e.g., 193 nm and 248 nm equipment) to be smaller.

Note, however, that such photoresist feature shrinkage is not required. For instance, in other embodiments, more subtle changes to the resist can be effected by selectively changing the time-temperature profile of the sub-second annealing process. In some cases, a partial or otherwise fleeting reflow of the photoresist can be used to smooth the pattern surface without actually shrinking the pattern. Thus, for example, instead of a 1-micron-wide photoresist line having a jagged edge, a 1-micron-wide photoresist line having a relatively smooth edge is provided. In a similar fashion, porosity or defects within the deposited photoresist feature can be eliminated or otherwise reduced by a sub-second annealing-induced reflow of the photoresist, as variously described herein.

The sub-second annealing process can be carried out in a number of ways. In accordance with some embodiments, a photoresist pattern (e.g., on a wafer or other suitable substrate) can be subjected to a relatively short energy pulse that heats the photoresist to a given temperature (flash temperature). Any suitable annealing source or sources capable of providing time-temperature profiles as described herein can be used to provide the short energy pulse, including plasma, laser, etc. The duration of the pulse is generally less than 1 second, and in some example cases is in the range of about 1-500 ms, with one specific example in the range of about 1-100 ms (e.g., less than or equal to about 80 ms) for flash-based sub-second annealing, or in the range of about 10 µs to 1 ms for laser-based sub-second annealing. A combination of such suitable energy sources may be used as well (e.g., plasma and laser). The flash temperature for a given short energy pulse process can vary and will depend on the photoresist being used, the desired effect on the photoresist, and temperature constraints of the wafer (and structures formed thereon). In some example cases, the flash temperature is a temperature that brings the photoresist to its melting point (e.g., glass transition temperature, $T_g$, ±15%), or just below that melting temperature (e.g., 80% of $T_g$). In some such cases, the flash temperature heats the photoresist to beyond its melting temperature (e.g., $T_g$+20° C., or some appropriate percentage). As will be appreciated, the time of such high-energy annealing is relatively short, as prolonged exposure to such temperatures generally may have an adverse impact on the photoresist pattern (e.g., melting and excessive or otherwise undesired reforming or running). Thus, the time-temperature profile of the sub-second annealing process can be varied and fine-tuned to provide the desired effect for a given application.

In some embodiments, the sub-second annealing process may include initial heating of the photoresist feature(s) prior to the short energy pulse. In general, the initial heating can be used to make the subsequent sub-second annealing process more efficient and/or otherwise more effective (e.g., because less energy of the pulse will be dissipated on bringing the photoresist to the flash temperature). Alternatively, or in addition to, initial heating can be used to modulate photoresist properties prior to the short energy pulse. Any suitable initial heat source or sources capable of providing time-temperature profiles as described herein can be used, including halogen lamps, furnaces, hot plates, plasma, laser, etc. For instance, a given photoresist feature/pattern (in part or in whole) can be initially heated to a transitional temperature (e.g., less than melting point of the photoresist, such as 50-80% of $T_g$) for a certain length of time such as by spike annealing for about 1 s and/or by soak annealing for about 1 s or greater. After such an initial heating process, the photoresist then can be subjected to a short energy pulse process as previously described. As will be appreciated, in some such cases where an initial heat process is used, the subsequent short energy pulse process may be shorter and/or of lower power relative to a short energy pulse process without any initial heating process.

Thus, the time-temperature profile of the sub-second annealing process can be adjusted to achieve the target three-dimensional profile and/or smoothness and/or reduced defect density for a given photoresist pattern. Numerous applications where the ability to modulate dimensions, line-edge roughness, and profiles of small features made of photoresist materials will be apparent in light of this disclosure. The techniques provided herein can be used to modulate features of any photoresist material types (e.g., organic, inorganic, molecular, and hybrid photoresist materials), but in some specific embodiments are used for modifying organic photoresists that have a low melting point (e.g., $T_g$ less than about 150° C.). After sub-second annealing a given photoresist feature (e.g., on a wafer/structure), visual inspection (e.g., using a microscope or SEM) may be used to show that the photoresist profile on the wafer/structure has been altered in accordance with an embodiment of the preset invention.

Methodology

Figure 1A:
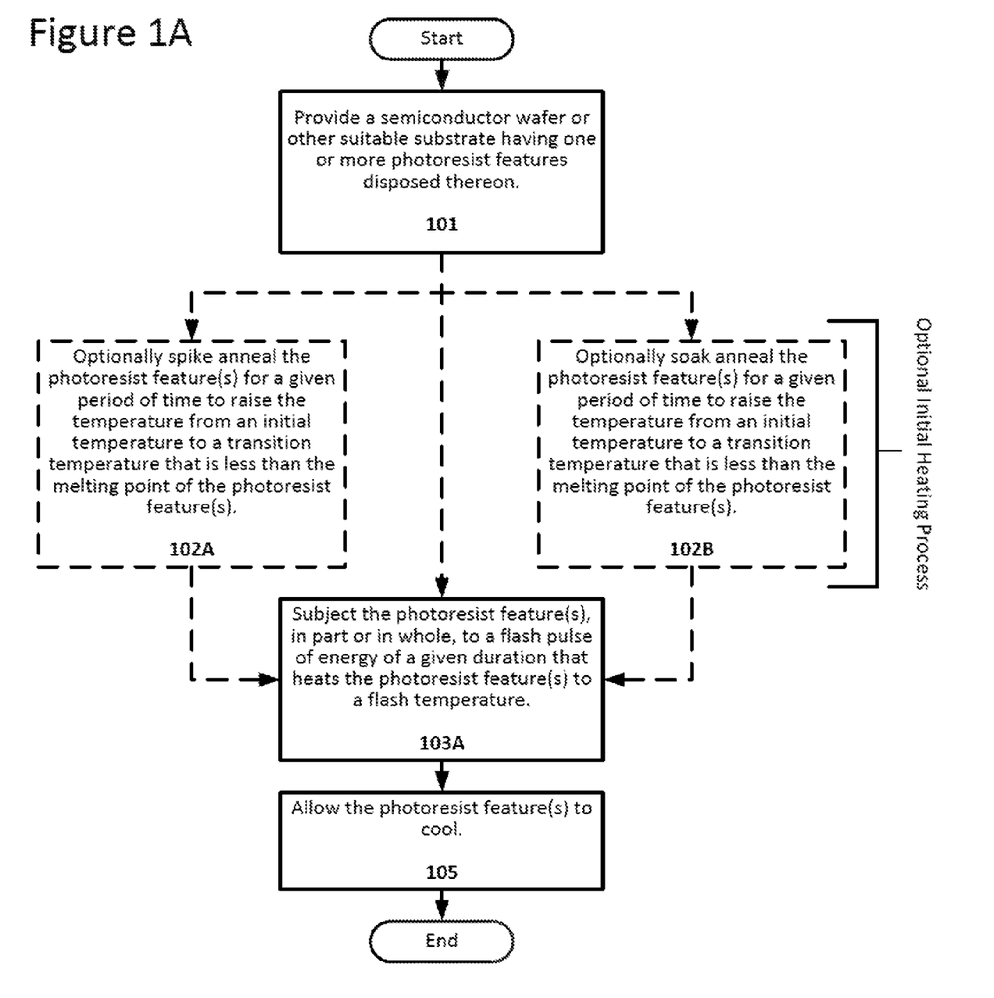
FIG. 1A is a flow diagram illustrating an example method of sub-second annealing, configured in accordance with an embodiment of the present invention.

FIG. 1A is a flow diagram illustrating an example method of sub-second annealing, configured in accordance with an embodiment of the present invention. As in block 101, provide a semiconductor wafer or other substrate that is suitable for patterning, which has one or more photoresist features disposed thereon. These initial photoresist features can be deposited or otherwise provisioned using any number of conventional or custom patterning processes. In some embodiments, the wafer/substrate may be, for example, a metal, silicon, germanium, III-V materials, oxide, nitride, or combinations thereof. In some embodiments, the wafer/substrate may be configured, for example, as a bulk substrate, a semiconductor-on-insulator (XOI, where X is a semiconductor material such as silicon, germanium, or germanium-enriched silicon), or a multi-layered structure. Other suitable wafer/substrate materials and/or configurations will depend on a given application and will be apparent in light of this disclosure.

The photoresist feature(s) may be made of any resist material, including, but not limited to, an organic photoresist material (e.g., poly(methyl methacrylate), poly(dimethyl glutarimide), phenol formaldehyde resin, SU-8, or other polymer), an inorganic photoresist material (e.g., chalcogenide), a molecular photoresist material (e.g., truxene), a hybrid of the aforementioned, or any other material suitable for patterning on the wafer/substrate. In some embodiments, the photoresist feature(s) may constitute a material having a melting point (e.g., glass transition temperature, $T_g$) in the range of about 150-200° C., while in other embodiments the melting point may be less than or equal to about 150° C. As will be appreciated, the melting point will depend on the photoresist material used, and the claimed invention is not intended to be limited to a particular temperature range. The photoresist feature(s) may be of any desired initial dimensions, which may depend on factors such as the feature to be formed on the wafer/substrate, the process node, and the capability of the lithography equipment being used. In accordance with some embodiments, the initial dimensions of a given photoresist feature will be different from its final dimensions after sub-second annealing. The photoresist feature(s) may be patterned using any suitable deposition and lithography methods, as will be apparent in light of this disclosure.

As in block 103A, subject the one or more photoresist features (e.g., on the wafer/substrate), in part or in whole, to a flash pulse of energy of a given duration that heats the photoresist feature(s) to a desired flash temperature. In any given embodiment, the flash temperature may be less than, equal to, or greater than the melting point of the photoresist material and may be sufficiently high to achieve a given minimum amount of photoresist melting/reflowing/smoothing while maintaining the integrity of a photoresist feature, as appropriate for a given application. In some embodiments, the flash temperature achieved may be a temperature that is sufficiently high to achieve changes in photoresist profile in one, two, or three dimensions, to smooth or otherwise reduce photoresist line width/edge roughness, and/or to reduce defect density for a given application.

The flash pulse of energy may be generated by any suitable source that provides exposure to sufficiently high-intensity energy for a sufficiently short exposure time to achieve a desired flash temperature for a given application. In some example cases, a selective light generator may be used to expose the photoresist feature(s) to electromagnetic radiation of a range of wavelengths (e.g., visible, microwave, infrared, or ultraviolet spectrums) or of a particular wavelength (e.g., a laser, as discussed in further detail below with reference to FIG. 1B). In other embodiments and as best shown in FIG. 1A, a high-intensity and/or rapidly discharging plasma (e.g., a plasma struck with a noble gas) may provide a sufficient flash pulse of energy for injecting thermal energy to achieve a desired flash temperature, in some example embodiments. In some embodiments, the flash pulse energy source generates light by triggering ionization and conducting a high voltage pulse across a suitable medium enclosed at or above atmospheric pressure in an appropriate housing. In some example embodiments, the medium may include one or more noble gases. Other types of mediums/plasma sources also may be used with suitable materials (e.g., metal halides, sodium, mercury, sulfur, etc.), in some embodiments. The specific type of plasma energy source can vary from one application to the next, as will be apparent in light of this disclosure.

The intensity of the flash pulse of energy may be adjusted as desired for a given application and will depend in part on the flash temperature to be achieved. In one or more embodiments, the flash pulse may be of a sufficiently high intensity to achieve a flash temperature less than, equal to, or greater than the melting point of a given photoresist feature. In cases where the intensity of the flash pulse of energy is sufficiently high to achieve a flash temperature greater than (or even much greater than) the melting point of a given photoresist feature, it may be desirable to adjust the flash pulse to have a sufficiently short duration (e.g., decrease the flash pulse width, FPW) to achieve the desired effect (e.g., tailoring/altering of dimensions, smoothing, and/or reducing defect density) on a given photoresist feature (in part or in whole) without completely melting or destroying such feature, in accordance with one or more embodiments of the present invention. In some example embodiments, the FPW may be on the order of milliseconds, and in one specific example embodiment may be less than or equal to about 100 ms (e.g., less than or equal to about 80 ms). Flash pulses of greater or lesser duration may be applied as appropriate for a given application, as will be apparent in light of this disclosure. In some embodiments, the intensity of the flash pulse across its FPW may be substantially constant or may be made to vary in time (e.g., flash temperature may be adjusted during a given annealing process). The source of the flash pulse may be configured to apply the flash pulse such that it is pulsed within its duration and/or is continuous (e.g., not pulsed) within its duration. In some example embodiments, the flash temperature may be adjusted to independently or simultaneously alter/tailor photoresist profile in one, two, or three dimensions, to smooth or otherwise reduce photoresist line width/edge roughness, and/or to reduce defect density for a given application.

The process may continue as in block 105 with allowing the one or more photoresist features to cool. In some embodiments of the present invention, various aspects of the cooling process may be adjusted to assist with achieving a desired three-dimensional photoresist profile, smoothness, and/or reduced defect density. The rate of temperature reduction of the photoresist feature(s) (and/or wafer/substrate) may be high or low or otherwise varied. In some embodiments, for example, cooling is carried out by simply removing the heat source (passive cooling). In other embodiments, the cooling can be carried out using an active cooling scheme such as blackbody cooling, conduction cooling, convection cooling, and/or injection cooling (e.g., nitrogen injection). As will be appreciated in light of this disclosure, note that cooling can be carried out during and/or after the sub-second flash-based annealing process (block 103A). Numerous suitable passive and/or active cooling schemes will be apparent in light of this disclosure, and any combination of cooling techniques can be used to provide the desired cooling profile.

In some example embodiments of the present invention, a spike annealing and/or soak annealing optionally may be included to preliminarily prepare (initial heating) the photoresist feature(s) (e.g., on the wafer/substrate) for the flash pulse of energy of block 103A (or laser energy of block 103B of FIG. 1B, as discussed below). A given application may benefit from utilizing one of the following (or other) optional initial heating processes.

In some example cases, the photoresist feature(s) may be spike annealed, as in block 102A, before being subjected to the flash pulse of block 103A (or laser source of block 103B of FIG. 1B, as discussed below). In the optional spike annealing, the photoresist feature(s) may be heated via a given source (e.g., a suitable halogen lamp) for a given period of time to raise the temperature from an initial temperature to a transition temperature that is, in some embodiments, less than the melting point of the photoresist material (or a range of such temperatures). In some example embodiments, the duration of the spike annealing may be adjusted as desired and may depend, in part, on the intensity of the source used to spike anneal and/or any desired changes to be achieved in a given photoresist pattern. In some specific example embodiments, the duration of the optional spike annealing may be, about 1 second, though longer or shorter durations may be desirable for a given application and will be apparent in light of this disclosure. In some embodiments, the transition temperature achieved during the optional spike annealing may be, for example, in the range of about 75-100° C., though higher or lower temperatures may be desirable and will be apparent in light of this disclosure (e.g., a transition temperature in the range of 50-80% of the melting temperature of the photoresist feature). In spike annealing, once the desired transition temperature is achieved, exposure to the energy source may be terminated (e.g., the power to the energy source may be cut), and the photoresist feature(s) may begin to cool from that transition temperature. In some embodiments, the ramp rate of the spike annealing energy source may be adjusted to independently or simultaneously alter/tailor photoresist profile in one, two, or three dimensions, to smooth a given photoresist feature, and/or to reduce defect density.

As an alternative option to spike annealing, or as a supplement to spike annealing, the photoresist feature(s) (e.g., on a wafer/substrate) may be soak annealed, as in block 102B, before being subjected to the flash pulse of block 103A (or laser energy of block 103B of FIG. 1B, as discussed below). In soak annealing, the photoresist feature(s) may be heated via a given source (e.g., a suitable halogen lamp or furnace) for a given period of time to raise the temperature from an initial temperature to a transition temperature that is, in some embodiments, less than the melting point of the photoresist material (or a range of such temperatures). In some example embodiments, the duration of the soak annealing may be adjusted as desired and may depend, in part, on the intensity of the source used to soak anneal and/or any desired changes to be achieved in a given photoresist pattern. In some embodiments, the duration of the optional soak annealing may be, for example, on the order of seconds or minutes, and in one specific example embodiment may be in the range of about 1-60 seconds, though longer or shorter soak durations may be desirable for a given application and will be apparent in light of this disclosure. In some embodiments, the transition temperature achieved during the optional soak annealing may be, for example, in the range of about 75-100° C., though higher or lower temperatures may be desirable and will be apparent in light of this disclosure (e.g., a transition temperature in the range of 50-80% of the melting temperature of the photoresist feature). In soak annealing, once the desired transition temperature is achieved, exposure to the energy source may be controlled so as to maintain that transition temperature for the remainder of the specified duration before being terminated (e.g., the power to the energy source may be cut), and the photoresist feature(s) may begin to cool from that transition temperature. In some embodiments, the ramp rate of the soak annealing energy source may be adjusted to independently or simultaneously alter/tailor photoresist profile in one, two, or three dimensions, to smooth a given photoresist feature, and/or to reduce defect density.

If either of the optional spike annealing of block 102A or the optional soak annealing of block 102B is implemented, then the flash pulse of energy of block 103A (or laser energy of block 103B of FIG. 1B, as discussed below) may be said to further heat the photoresist feature(s) (in whole or in part) from the transition temperature achieved in either of blocks 102A/102B to the desired flash temperature.

Figure 1B:
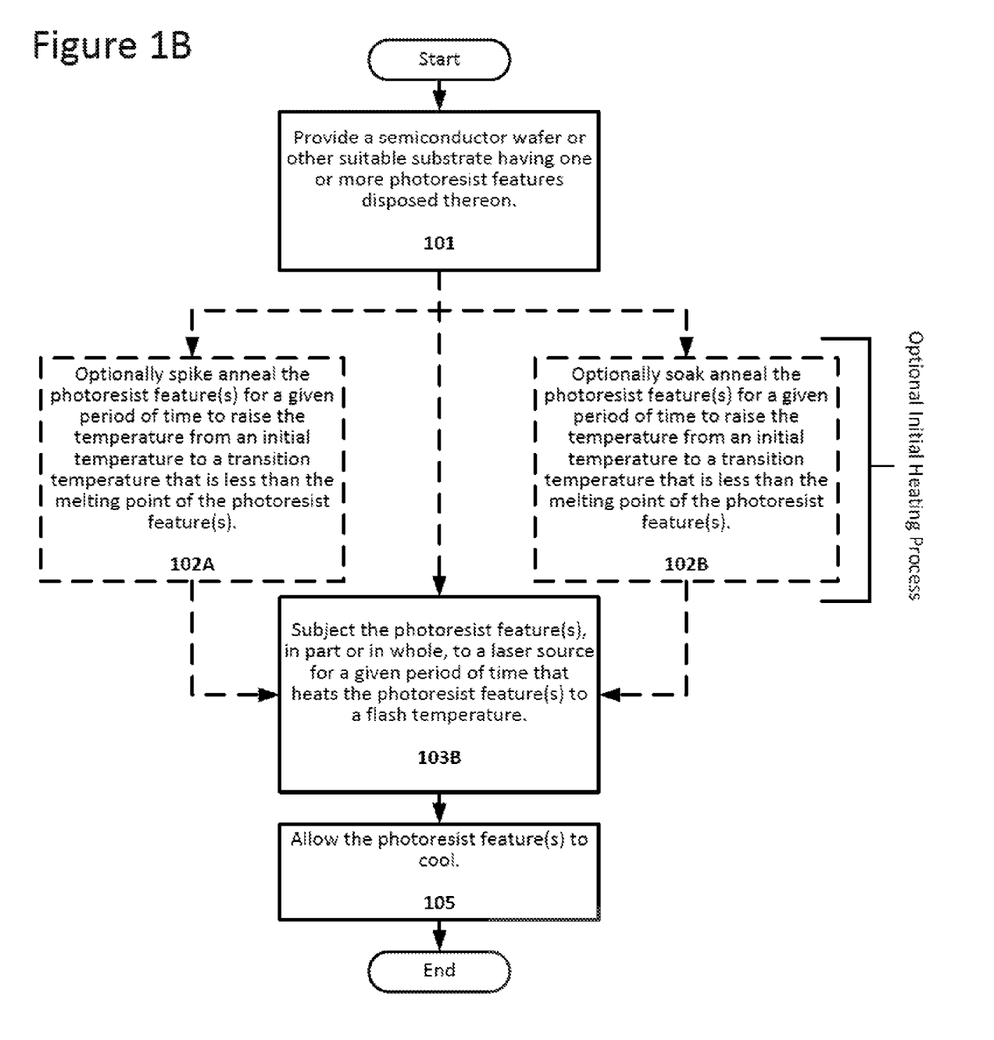
FIG. 1B is a flow diagram illustrating an example method of sub-second annealing, configured in accordance with another embodiment of the present invention.

FIG. 1B is a flow diagram illustrating an example method of sub-second annealing, configured in accordance with another embodiment of the present invention. In some embodiments, it may be desirable to sub-second anneal by utilizing a laser source to apply a single wavelength (or range of wavelengths) of electromagnetic radiation for a suitable period of time to achieve the flash temperature. The description provided above with reference to blocks 101, 105, and optional blocks 102A and 102B of FIG. 1A applies equally as well here in reference to the example method of FIG. 1B. As previously explained, note that cooling at block 105 can be carried out during and/or after the sub-second laser-based annealing process (block 103B).

As in block 103B, subject the one or more photoresist features (e.g., on the wafer/substrate), in part or in whole, to a laser source for a given period of time that heats the photoresist feature(s) to a desired flash temperature. As used herein, flash temperature is not limited to flash-based sub-second annealing (e.g., FIG. 1A), but also may refer to laser-based sub-second annealing (e.g., FIG. 1B). In any given embodiment, the flash temperature may be less than, equal to, or greater than the melting point of the photoresist material and may be sufficiently high to achieve a given minimum amount of photoresist melting/reflowing while maintaining the integrity of a photoresist feature, as appropriate for a given application. In some embodiments, the flash temperature achieved may be a temperature that is sufficiently high to achieve changes in photoresist profile in one, two, or three dimensions, to smooth or otherwise reduce photoresist line width/edge roughness, and/or to reduce defect density for a given application.

The laser energy may be generated by any suitable laser source that provides exposure to sufficiently high-intensity energy for a sufficiently short exposure time to achieve a desired flash temperature for a given application. In some example cases, a laser source may be used to expose the photoresist feature(s) (e.g., on a wafer/substrate) to electromagnetic radiation of a given wavelength (or range of wavelengths) for a given period of time, thus injecting sufficient thermal energy to achieve a desired flash temperature, in some example embodiments. The source of the laser energy may be configured to apply the laser such that it is pulsed within its duration and/or is continuous (e.g., not pulsed) within its duration. As will be apparent in light of this disclosure, use of an appropriate laser source (appropriate wavelength or range of wavelengths) may depend, in part, on the material(s) used in the photoresist and/or substrate/wafer.

The intensity of the laser pulse may be adjusted as desired for a given application and will depend in part on the flash temperature to be achieved. In one or more embodiments, the laser may be of a sufficiently high intensity to achieve a flash temperature less than, equal to, or greater than the melting point of a given photoresist feature. In cases where the intensity of the laser is sufficiently high to achieve a flash temperature greater than (or even much greater than) the melting point of a given photoresist feature, it may be desirable to adjust the exposure time to a sufficiently short duration to achieve the desired effect (e.g., tailoring/altering of dimensions, smoothing, and/or reducing defect density) on a given photoresist feature (in part or in whole) without completely melting or destroying such feature, in accordance with one or more embodiments of the present invention. In some example embodiments, the exposure time for the laser may be on the order of nanoseconds, microseconds, and/or milliseconds, and in one specific example embodiment is in the range of about 10-1000 µs. As will be appreciated in light of this disclosure, the duration of exposure to the laser source can vary depending on the laser power (e.g., energy delivered to the photoresist). In general, the greater the energy delivered, the shorter the exposure time. Thus, numerous embodiments will be apparent, and the claimed invention is not intended to be limited to a particular laser exposure duration or power. Rather, any suitable time-temperature profile to effectuate the desired change in the photoresist pattern can be used, which may be established, for example, based on theoretical analysis and/or empirical analysis. Laser exposure of greater or lesser duration may be applied as appropriate for a given application and will be apparent in light of this disclosure. In some embodiments, the intensity of the laser energy may be substantially constant or may be made to vary in time (e.g., flash temperature may be adjusted during a given sub-second annealing process). In some example embodiments, the flash temperature applied via the laser source may be adjusted to independently or simultaneously alter/tailor photoresist profile in one, two, or three dimensions, to smooth or otherwise reduce photoresist line width/edge roughness, and/or to reduce defect density for a given application.

In any instance, upon approaching and/or exceeding the melting point of a given photoresist material by flash-based sub-second annealing (e.g., FIG. 1A) or laser-based sub-second annealing (e.g., FIG. 1B), the photoresist feature(s) will melt/reflow to some degree, in accordance with an embodiment of the present invention. Some minimal amount of melting/reflowing may be desirable, in one or more embodiments, to tailor/modify photoresist profile in one, two, or three dimensions, to smooth or otherwise reduce photoresist line width/edge roughness, and/or to reduce defect density. However, if the melting point is exceeded for a prolonged period of time, the photoresist feature(s) (and any attendant photoresist pattern, if applicable) may be damaged or otherwise negatively impacted. Thus, as will be appreciated, it may be desirable to ensure that the applicable melting point limit of the photoresist material is not exceeded for a protracted period of time by adjustment of, for example: (1) the intensity and/or duration (FPW) of the flash pulse of energy (as in block 103A of FIG. 1A); or (2) the intensity and/or exposure time of the laser source (as in block 103B of FIG. 1B).

In various embodiments of the present invention, sub-second annealing may be implemented to alter/adjust the profile of a photoresist feature pre- and/or post-development to desired parameters, and, in some example instances, may be implemented to shrink and/or reflow photoresist, thereby achieving a target profile in one, two, or three dimensions. In some such embodiments, adjustments may be made to the time-temperature profile of a given sub-second annealing process (flash pulse and/or laser) to tailor/alter photoresist profile.

Figure 2A:
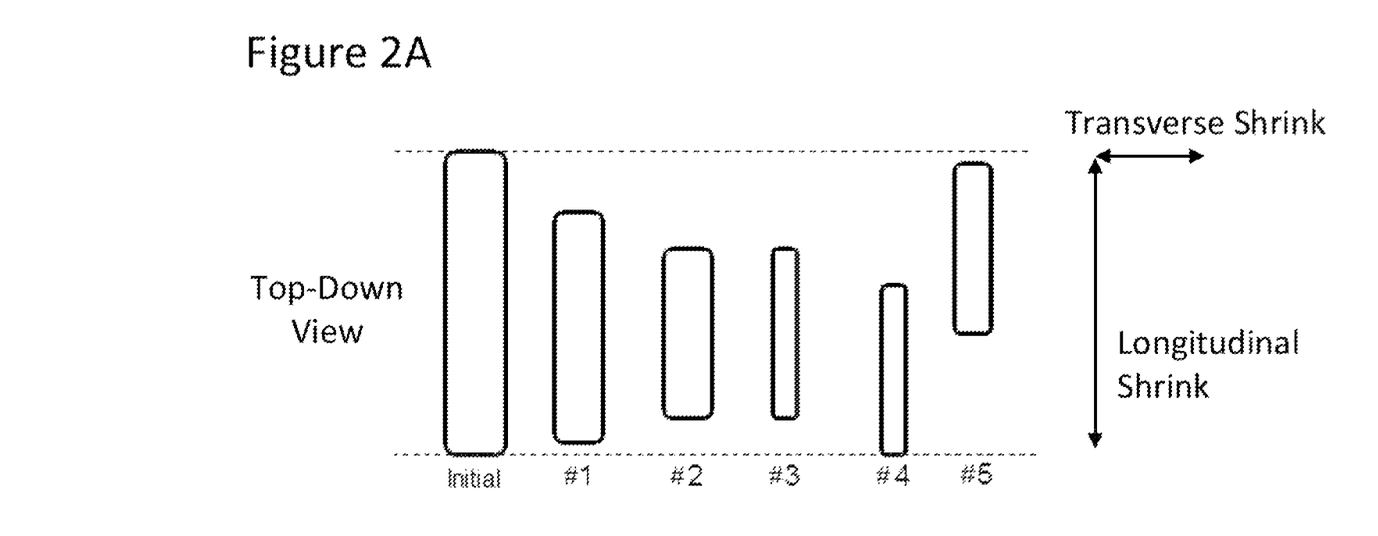
FIG. 2A is a top-down view of a schematic depicting example changes to a photoresist profile via sub-second annealing, in accordance with an embodiment of the present invention.
Figure 2B:
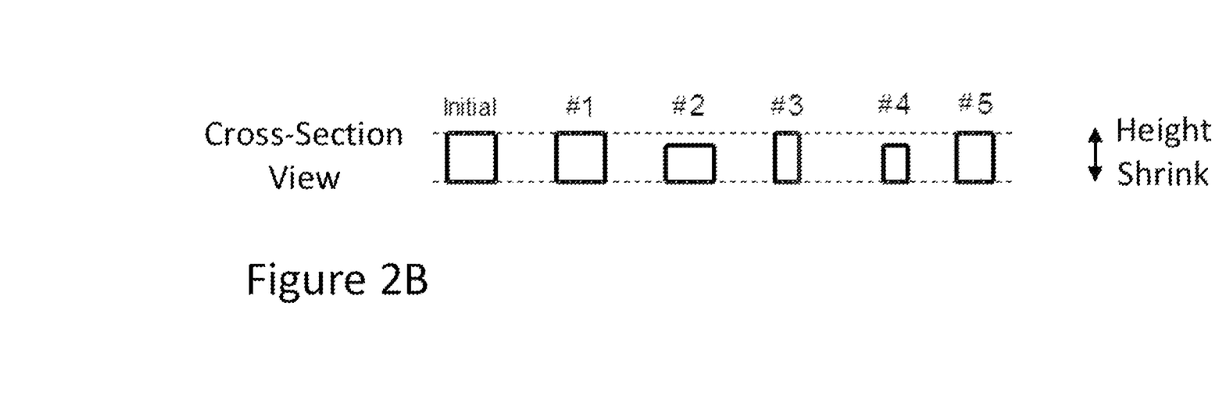
FIG. 2B is a cross-section view of the schematic of FIG. 2A.

FIG. 2A is a top-down view of a schematic depicting example changes to a photoresist profile via sub-second annealing, in accordance with an embodiment of the present invention. FIG. 2B is a cross-section view of the schematic of FIG. 2A. In each of those figures, the photoresist line labeled 'Initial' represents an example photoresist feature of given initial dimensions, which has not yet undergone sub-second annealing in accordance with an embodiment of the present invention. Each of photoresist lines #1-5 represents an example photoresist feature which has undergone sub-second annealing (e.g., flash pulse and/or laser) in accordance with a given embodiment of the present invention. As can be seen from these depicted examples, the three-dimensional profile of photoresist lines #1-5 have been altered in various ways to achieve changes from their initial dimensions to their respective final dimensions, in accordance with one or more embodiments of the present invention. Changes in photoresist profile may be achieved independently or simultaneously in one, two, or three dimensions. For example, changes may be achieved via sub-second annealing (flash pulse and/or laser): (1) to the length only; (2) to the width only; (3) to the height only; (4) to the length and width only; (5) to the length and height only; (6) to the width and height only; or (7) to the length, width, and height.

Experimental Implementation

As will be appreciated in light of this disclosure, adjustments may be made to the time-temperature profile of the sub-second annealing process to tailor/modify photoresist profile in one, two, or three dimensions, to smooth or otherwise reduce photoresist line width/edge roughness, and/or to reduce defect density, in accordance with various embodiments. In some specific example embodiments, changes may be effectuated in the magnitude of resist shrinkage in one or more dimensions by manipulating one or more variables of the time-temperature profile, including, but not limited to: (1) the duration of the flash pulse of energy (flash pulse width, FPW) or the exposure time of the laser source; and/or (2) the relative proximity of the flash temperature to the melting point of the photoresist material. Furthermore, in cases where a preliminary spike annealing or soak annealing optionally has been performed to initially heat the integrated circuit during the sub-second annealing process, additional variables of the time-temperature profile may be manipulated, including, but not limited to: (3) the spike/soak annealing time; and/or (4) the spike/soak annealing temperature.

In accordance with an example embodiment of the present invention, flash-based sub-second annealing via a flash pulse of energy was used to alter/modulate the length (longitudinal direction) and/or width (transverse direction) of a series of photoresist lines made of an organic polymer material and disposed on a given substrate having a given degree of anti-reflectivity. A preliminary soak annealing was optionally included. Observed results are recorded in Table 1 below and represented in graphic form in FIGS. 3 and 4.

Figure 3:
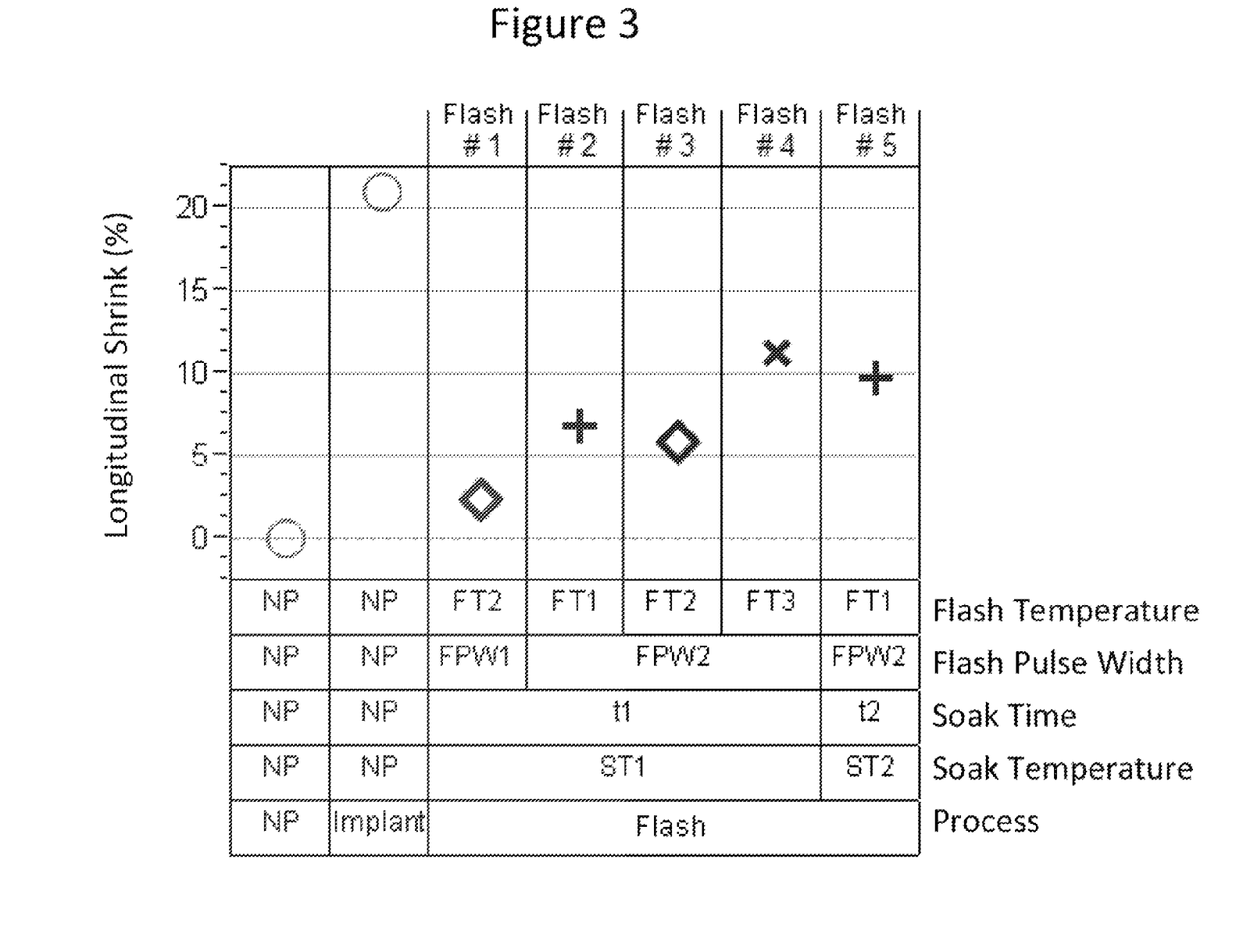
FIG. 3 is a graph depicting longitudinal (lengthwise) shrinkage of photoresist features via an example flash-based sub-second annealing process configured in accordance with an embodiment of the present invention.
Figure 4:
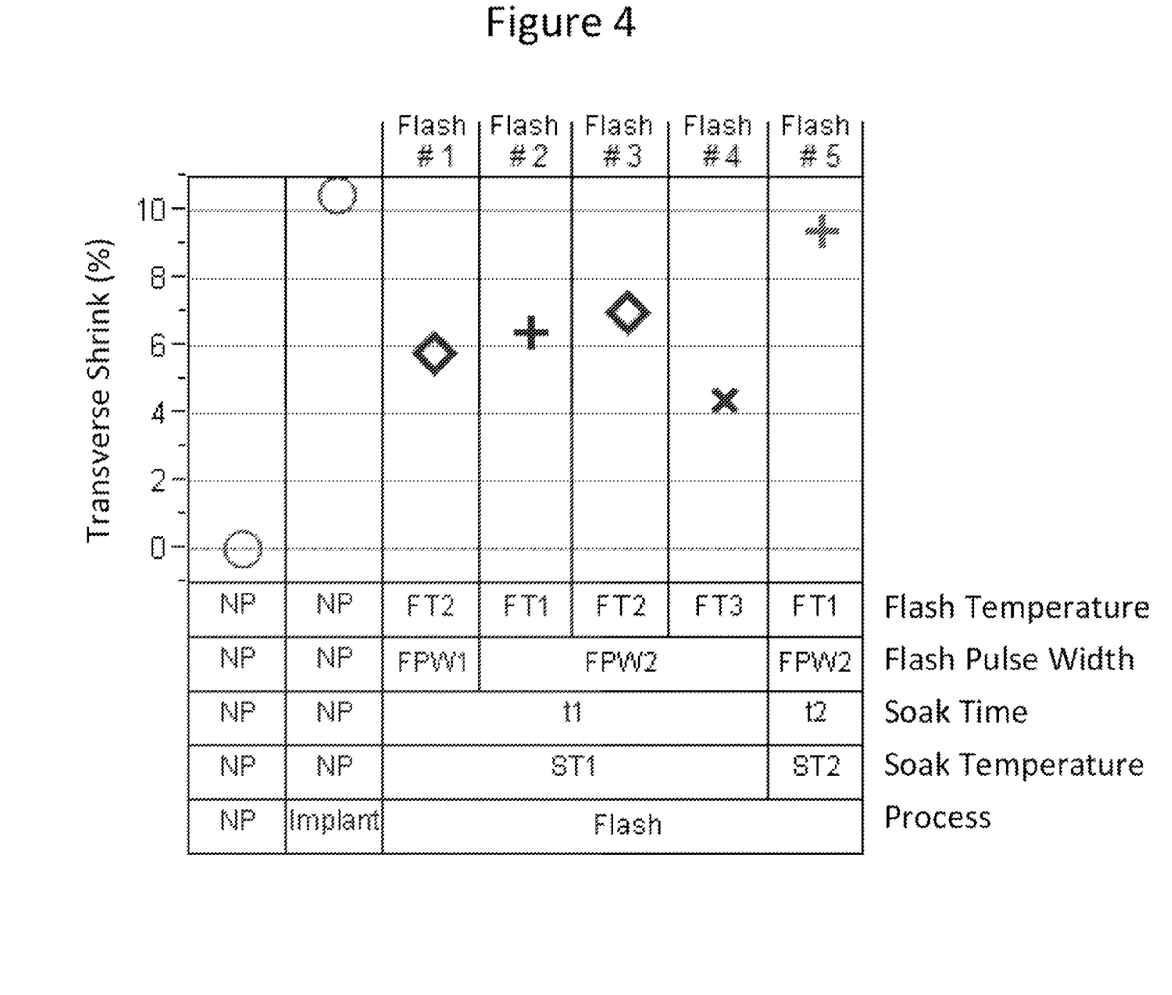
FIG. 4 is a graph depicting transverse (widthwise) shrinkage of photoresist features via an example flash-based sub-second annealing process configured in accordance with an embodiment of the present invention.

The photoresist sample labeled 'NP' (No Process) was not subjected to sub-second annealing in accordance with an embodiment of the present invention and thus served as a control sample for the experiment. The photoresist sample labeled 'Implant' was not subjected to sub-second annealing in accordance with an embodiment of the present invention, but did undergo an implantation process (e.g., high current implant). The photoresist samples labeled "Flash #1" through "Flash #5" each underwent an optional soak annealing followed by a sub-second annealing via a flash pulse of energy provided by an inert gas-based plasma lamp. For these five photoresist samples, in accordance with some example embodiments of the present invention, various soak times (t1=4 s; t2=10 s) and soak temperatures (ST1=75° C.; ST2=100° C.) were implemented in the optional preliminary soak annealing. As can be further seen, various flash temperatures (FT1=155° C.; FT2=175° C.; FT3=195° C.) and flash pulse widths (FPW1=1.5 ms; FPW2=3.0 ms) were implemented in the remainder of the flash-based sub-second annealing process. Embodiments implementing different time and temperature values will be apparent in light of this disclosure, and the claimed invention is not intended to be limited to these specific example sub-second annealing processes.

FIG. 3 is a graph depicting longitudinal (lengthwise) shrinkage of photoresist features via an example flash-based sub-second annealing process configured in accordance with an embodiment of the present invention. As can be seen from the plotted data, longitudinal shrinkage of about 2-11% may be achieved with changes to flash temperature (FT) and/or flash pulse width (FPW) in the sub-second annealing process, as compared to the NP control, which exhibited no shrinkage, and the reference implant process, which exhibited longitudinal shrinkage of about 21%. These results are summarized below in Table 1 under the column heading 'Longitudinal Shrink.' The data points of FIG. 3 effectively demonstrate, in accordance with an embodiment of the present invention, that the longitudinal characteristics of photoresist profile may be tailored/modulated (in the longitudinal direction) by adjusting, for example, the flash temperature and/or the time spent at the flash temperature (e.g., as governed by the flash pulse width, FPW, in this example). The results of FIG. 3 can be achieved by any suitable sub-second annealing process provided herein, such as a flash-based energy source (e.g., FIG. 1A), a laser-based energy source (e.g., FIG. 1B), or other suitable energy sources that meet the desired time-temperature profile for a given application, or a combination of such energy sources.

FIG. 4 is a graph depicting transverse (widthwise) shrinkage of photoresist features via an example flash-based sub-second annealing process configured in accordance with an embodiment of the present invention. As can be seen from the plotted data, transverse shrinkage of about 4-9% may be achieved with changes to soak temperature (ST) and/or soak time (t) in the optionally included preliminary soak annealing portion of the sub-second annealing process, as compared to the NP control, which exhibited no shrinkage, and the reference implant process, which exhibited transverse shrinkage of about 10%. These results are summarized below in Table 1 under the column heading 'Transverse Shrink.' As can further be seen, an increase in soak temperature/soak time from ST1-t1 to ST2-t2 resulted in an increase in transverse shrinkage from 4-6% (for ST1-t1) to about 9% (for ST2-t2). The data points of FIG. 4 effectively demonstrate, in accordance with an embodiment of the present invention, that the transverse characteristics of photoresist profile may be tailored/modulated (in the transverse direction) by adjusting, for example, the soak temperature and/or the soak time of an optionally included preliminary soak annealing in the sub-second annealing process. Similar to FIG. 3, the results of FIG. 4 can be achieved by any suitable sub-second annealing process provided herein or which otherwise meets the desired time-temperature profile for a given application, or a combination of such processes.

TABLE 1

| Applied Process | Longitudinal Shrink (%) | Transverse Shrink (%) | Shrink Type/Description |
|---|---|---|---|
| Implant | 21.0 | 10.5 | Anisotropic - Longitudinally Biased |

TABLE 1-continued

| Applied Process | Longitudinal Shrink (%) | Transverse Shrink (%) | Shrink Type/Description |
| --- | --- | --- | --- |
| Flash #1 | 2.4 | 5.8 | Anisotropic - Transversely Biased |
| Flash #2 | 6.8 | 6.4 | Isotropic |
| Flash #3 | 5.8 | 7.1 | Anisotropic - Transversely Biased |
| Flash #4 | 11.2 | 4.4 | Anisotropic - Longitudinally Biased |
| Flash #5 | 9.8 | 9.4 | Isotropic |

As evident from FIGS. 3 and 4 (and summarized in Table 1), sub-second annealing in accordance with an embodiment of the present invention may be used to alter/modify photoresist lines in one, two, or three dimensions. Shrinkage from the sub-second annealing process may be isotropic (exhibiting shrinkage substantially uniformly in all observed directions) or anisotropic (exhibiting shrinkage in a substantially directionally-dependent or directionally-varied fashion), as determined by process conditions. In cases of anisotropic shrinkage, the change in photoresist profile may be transversely biased or longitudinally biased, as determined by process conditions. Thus, sub-second annealing (e.g., flash pulse and/or laser), in accordance with an embodiment of the present invention, provides an effective method of fine-tuning/tailoring photoresist profile in up to three dimensions in an independent or simultaneous fashion.

Other variables may affect the sub-second annealing process, including, but not limited to: (1) photoresist material (e.g., polymer, organic, inorganic, molecular, hybrid, or otherwise); (2) source of the flash pulse and/or laser; and/or (3) wafer/substrate material(s). In some embodiments, the constituent material(s) of the wafer/substrate may be chosen to achieve greater or lesser coupling with the flash pulse (wavelength range) or laser (single wavelength or wavelength range) in the sub-second annealing process. In some embodiments, it may be desirable to have a given portion of the wafer/substrate be reflective and/or anti-reflective at a given wavelength or range of wavelengths of electromagnetic radiation, thus altering the interaction between the wafer/substrate and the flash pulse/laser used to anneal the photoresist feature(s).

In various embodiments, the disclosed techniques may be used in the fabrication of integrated circuits at, for example, any particular process nodes and half-nodes (e.g., 10 μm, 800 nm, 65 nm, 45 nm, 32 nm, 22 nm, 14 nm, 11 nm, and beyond). Other embodiments that can employ techniques described herein will be apparent in light of this disclosure.

Example System

Figure 5:
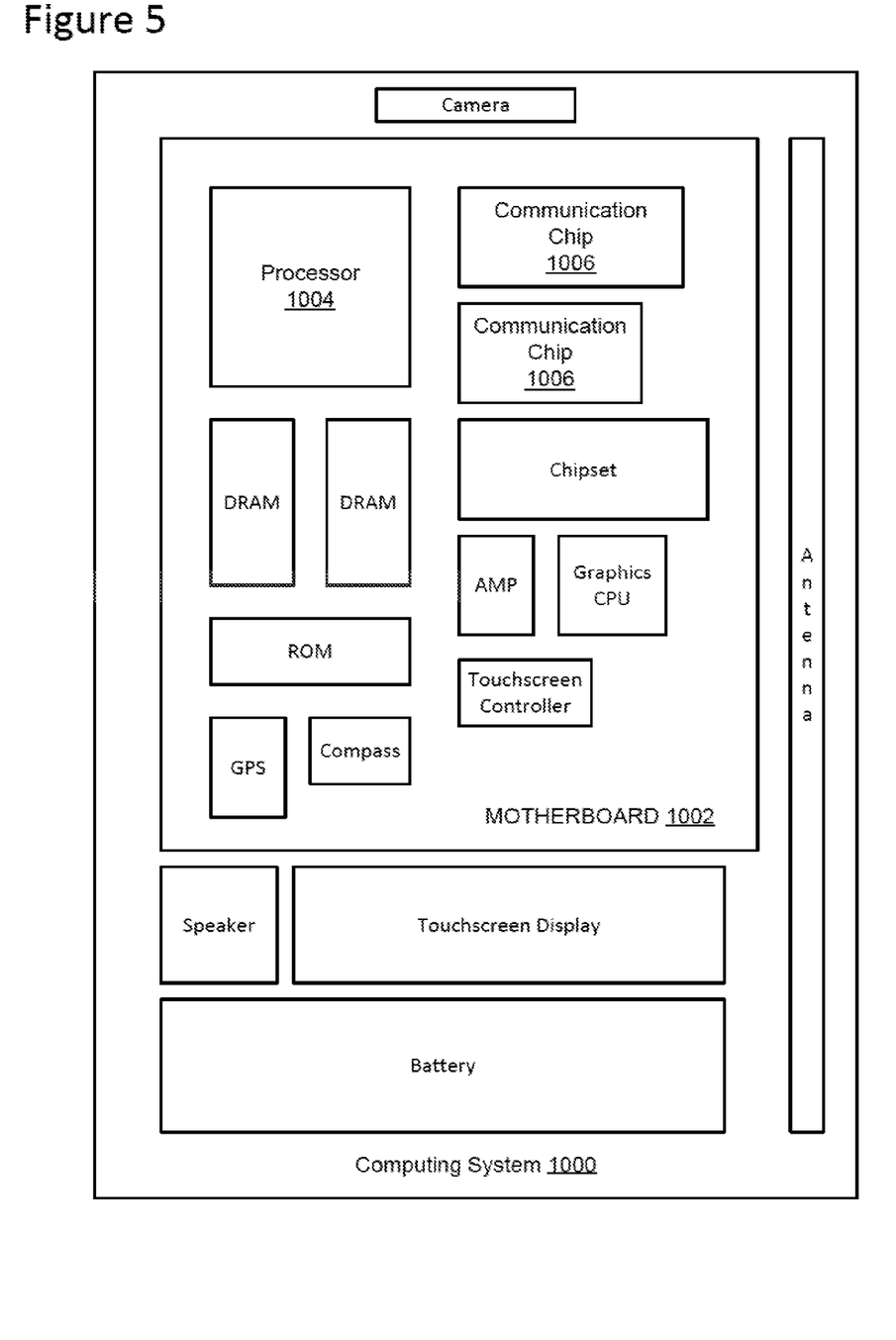
FIG. 5 illustrates a computing system implemented with one or more integrated circuit structures or devices formed by a sub-second annealing process configured in accordance with an embodiment of the present invention.

FIG. 5 illustrates a computing system 1000 implemented with one or more integrated circuit structures or devices formed by a sub-second annealing process configured in accordance with an embodiment of the present invention. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touch-screen display, a touchscreen controller, a battery, an audio codec, a video codec, a power amplifier, one or more filters (e.g., LC-tank, high-pass, low-pass, bandpass filters), a global positioning system (GPS) device, a compass, an accelerometer, a gyroscope, a speaker, a camera, and a mass storage device (such as a hard disk drive, compact disk (CD), digital versatile disk (DVD), and so forth). Any of the components included in computing system 1000 may include one or more integrated circuit structures or devices formed by sub-second annealing as described herein. These structures/devices can be used, for instance, to implement a transistor, a conductive run, or other circuit including small features. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX. LTE, Ev-DO, and others.

The processor 1004 of the computing system 1000 includes an integrated circuit die packaged within the processor 1004. In some embodiments of the present invention, the integrated circuit die of the processor includes onboard circuitry that is implemented with one or more integrated circuit structures or devices formed by sub-second annealing, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed by sub-second annealing as described herein (e.g., a transistor, a conductive run, or other circuit including small features). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs integrated circuit structures or devices formed by sub-second annealing as described herein.

Numerous embodiments will be apparent, and features described herein can be combined in any number of configurations. One example embodiment of the present invention provides a method that includes providing a substrate having a photoresist feature disposed thereon, and annealing the photoresist feature with a sub-second application of electromagnetic radiation at a flash temperature, wherein the electromagnetic radiation is continuous or pulsed during the sub-second application and at least one of shrinks the photoresist feature in at least one dimension, smoothes the photoresist feature, and/or reduces defect density in the photoresist feature. In some cases, the photoresist feature has a melting point temperature, and the flash temperature is greater than or equal to 80% of the melting point temperature. In some cases, the flash temperature is greater than the melting point temperature of the photoresist feature. In some cases, the melting point temperature of the photoresist feature is less than about 150° C. In some cases, the method includes, prior to annealing the photoresist feature, initially heating the photoresist feature over a period of time at a transition temperature that is less than the flash temperature. In some cases, initially heating the photoresist feature comprises spike annealing and the period of time is about 1 second. In some cases, initially heating the photoresist feature comprises soak annealing and the period of time is more than about 1 second. In some cases, the method includes, during and/or after annealing the photoresist feature, passively or actively cooling the photoresist feature. In some cases, the substrate is selectively reflective and/or anti-reflective to at least one wavelength of the electromagnetic radiation. In some cases, the photoresist feature comprises an organic photoresist material, an inorganic photoresist material, a molecular photoresist material, or a combination thereof. In some cases, the photoresist feature comprises an organic polymer having a melting point temperature that is less than about 150° C. In some cases, annealing the photoresist feature comprises at least one of plasma-based annealing and/or laser-based annealing. In some cases, the sub-second application of electromagnetic radiation at least one of rounds corners of the photoresist feature and/or modifies footing of the photoresist feature. In some cases, an integrated circuit is fabricated using the method. In some such cases, an electronic device comprises one or more of the integrated circuit. In some such cases, the electronic device comprises at least one of a memory circuit, a communication chip, a processor, and/or a computing system.

In another example embodiment of the present invention, a method is provided which includes providing a substrate having a photoresist feature disposed thereon and exposing the photoresist feature to a sub-second application of electromagnetic radiation from a plasma lamp and/or halogen lamp that heats the photoresist feature to a flash temperature that is greater than or equal to 80% of a melting point temperature of the photoresist feature, wherein the sub-second application has a pulse width less than or equal to about 100 ms.

In another example embodiment of the present invention, a method is provided which includes providing a substrate having a photoresist feature disposed thereon and exposing the photoresist feature to a sub-second application of electromagnetic radiation from a laser source that heats the photoresist feature to a flash temperature that is greater than or equal to 80% of a melting point temperature of the photoresist feature, wherein the photoresist feature is exposed for a period of time in the range of about 10-1000 µs.

In another example embodiment of the present invention, an integrated circuit is provided which includes a substrate and a photoresist feature disposed on the substrate, wherein the photoresist feature has been annealed with a sub-second application of electromagnetic radiation at a flash temperature, wherein the sub-second application has a pulse width of about 500 ms or less and at least one of shrinks the photoresist feature in at least one dimension, smoothes the photoresist feature, and/or reduces defect density in the photoresist feature. In some cases, the sub-second application of electromagnetic radiation at least one of rounds corners of the photoresist feature and/or modifies footing of the photoresist feature.

The foregoing description of example embodiments of the invention has been presented for the purposes of illustration and description. It is not intended to be exhaustive or to limit the invention to the precise forms disclosed. Many modifications and variations are possible in light of this disclosure. For instance, the sub-second annealing energy source (flash lamp, plasma lamp, laser, etc.) can be pulsed or continuous within its sub-second annealing operation, for a given application. Furthermore, a given photoresist feature, in whole or in part, may achieve the desired initial or flash temperature: (1) directly, such as by application of energy directly to the photoresist feature via any of the sub-second annealing techniques described herein; and/or (2) indirectly, such as by application of energy to the substrate/wafer on which the photoresist feature is disposed via any of the sub-second annealing techniques described herein. It is intended that the scope of the invention be limited not by this detailed description, but rather by the claims appended hereto.

What is claimed is:

1. A method comprising:
   providing a substrate having a photoresist feature disposed thereon; and
   annealing the photoresist feature with a sub-second application of electromagnetic radiation at a flash temperature, wherein the electromagnetic radiation is continuous or pulsed during the sub-second application and at least one of shrinks the photoresist feature in at least one dimension, smoothes the photoresist feature, and reduces defect density in the photoresist feature.

2. The method of claim 1 wherein the photoresist feature has a melting point temperature, and the flash temperature is greater than or equal to 80% of the melting point temperature.

3. The method of claim 2 wherein the flash temperature is greater than the melting point temperature of the photoresist feature.

4. The method of claim 2 wherein the melting point temperature of the photoresist feature is less than about 150° C.

5. The method of claim 1 wherein prior to annealing the photoresist feature, the method further comprises:
   initially heating the photoresist feature over a period of time to a transition temperature that is less than the flash temperature.

6. The method of claim 5 wherein initially heating the photoresist feature comprises spike annealing and the period of time is about 1 second.

7. The method of claim 5 wherein initially heating the photoresist feature comprises soak annealing and the period of time is more than about 1 second.

8. The method of claim 1 wherein at least one of during and after annealing the photoresist feature, the method further comprises:
passively or actively cooling the photoresist feature.

9. The method of claim 1 wherein the substrate is at least one of selectively reflective and anti-reflective to at least one wavelength of the electromagnetic radiation.

10. The method of claim 1 wherein the photoresist feature comprises an organic photoresist material, an inorganic photoresist material, a molecular photoresist material, or a combination thereof.

11. The method of claim 1 wherein the photoresist feature comprises an organic polymer having a melting point temperature that is less than about 150° C.

12. The method of claim 1 wherein annealing the photoresist feature comprises at least one of plasma-based annealing and laser-based annealing.

13. The method of claim 1 wherein the sub-second application of electromagnetic radiation at least one of rounds corners of the photoresist feature and modifies footing of the photoresist feature.

14. An integrated circuit fabricated using the method of claim 1.

15. A method comprising:

providing a substrate having a photoresist feature disposed thereon; and exposing the photoresist feature to a sub-second application of electromagnetic radiation from at least one of a plasma lamp and a halogen lamp that heats the photoresist feature to a flash temperature that is greater than or equal to 80% of a melting point temperature of the photoresist feature, wherein the sub-second application has a pulse width less than or equal to about 100 ms.

16. A method comprising:

providing a substrate having a photoresist feature disposed thereon; and exposing the photoresist feature to a sub-second application of electromagnetic radiation from a laser source that heats the photoresist feature to a flash temperature that is greater than or equal to 80% of a melting point temperature of the photoresist feature, wherein the photoresist feature is exposed for a period of time in the range of about 10-1000 μs.

* * * * *